(12) United States Patent
Metzler et al.

(10) Patent No.: US 6,704,382 B1
(45) Date of Patent: Mar. 9, 2004

(54) SELF-SWEEPING AUTOLOCK PLL (75) Inventors: Steven Metzler, Lisle, IL (US);
Charles Daugherty, Lisle, IL (US);
Thomas Ryan, Lisle, IL (US)

(73) Assignee: Tellabs Operations, Inc., Lisle, IL (US)

( * ) Notice: Subject to any disclaimer, the term of this patent is extended or adjusted under 35 U.S.C. 154(b) by 0 days.

(21) Appl. No.: 09/113,580

(22) Filed: Jul. 10, 1998

Related U.S. Application Data (60) Provisional application No. 60/052,284, filed on Jul. 11, 1997.

(51) Int. Cl.⁷ .............................. H03D 3/24; H03L 27/00
(52) U.S. Cl. ........................................ 375/376; 327/156
(58) Field of Search ................... 375/376; 327/43, 327/49; 331/4, 8, 11, 12, 25

(56) References Cited

U.S. PATENT DOCUMENTS

| | | | |
|---|---|---|---|
| 3,769,602 A | | 10/1973 | Griswold ..................... 329/122 |
| 4,180,783 A | | 12/1979 | Khalifa ......................... 331/2 |
| 4,206,420 A | | 6/1980 | Querry et al. ................. 331/4 |
| 4,308,505 A | * | 12/1981 | Besserschmitt .............. 331/25 |
| 4,375,693 A | * | 3/1983 | Kuhn .......................... 375/120 |
| 4,403,342 A | * | 9/1983 | Borras et al. ................. 455/76 |
| 4,404,530 A | * | 9/1983 | Stryer .......................... 331/1 |
| 4,464,771 A | * | 8/1984 | Sorensen ..................... 375/120 |
| 4,686,560 A | | 8/1987 | Balaban et al. ............... 358/19 |
| 4,715,050 A | * | 12/1987 | Tanaka et al. ................ 375/81 |
| 4,724,402 A | | 2/1988 | Ireland ........................ 331/4 |
| 4,757,279 A | * | 7/1988 | Balzano ........................ 331/4 |
| 4,876,700 A | * | 10/1989 | Grindahl ...................... 375/87 |
| 4,926,447 A | * | 5/1990 | Corsetto et al. ............. 375/120 |
| 4,970,474 A | | 11/1990 | Kennedy et al. ............... 331/2 |
| 5,099,213 A | * | 3/1992 | Yamakawa et al. ............ 331/4 |
| 5,148,123 A | * | 9/1992 | Ries .............................. 331/4 |
| 5,297,173 A | * | 3/1994 | Hikmet et al. ............... 375/118 |
| 5,475,718 A | * | 12/1995 | Rosenkranz ................. 375/376 |
| 5,477,177 A | * | 12/1995 | Wong et al. .................. 327/156 |
| 5,485,484 A | * | 1/1996 | Williams et al. ............. 375/376 |
| 5,487,093 A | * | 1/1996 | Adresen et al. .............. 375/376 |
| 5,506,627 A | | 4/1996 | Ciardi ......................... 348/515 |
| 5,541,556 A | | 7/1996 | Francis ......................... 331/4 |
| 5,550,515 A | * | 8/1996 | Liang et al. .................. 331/11 |
| 5,621,755 A | * | 4/1997 | Bella et al. .................. 375/219 |
| 5,719,908 A | * | 2/1998 | Greeff et al. ................ 375/376 |
| 5,787,135 A | * | 7/1998 | Clark .......................... 375/376 |
| 5,920,207 A | * | 7/1999 | Suresh ........................ 327/2 |
| 5,963,608 A | * | 10/1999 | Casper et al. ............... 375/373 |
| 5,987,085 A | * | 11/1999 | Anderson ................... 375/374 |

* cited by examiner

*Primary Examiner*—Jean B. Corrielus
(74) *Attorney, Agent, or Firm*—McAndrews, Held & Malloy, Ltd.

(57) ABSTRACT

An improved phase-lock loop circuit comprising a phase detector, a loop filter, and a voltage controlled oscillator. The phase detector samples the phase-lock loop input signal at various points in a cycle of the phase-lock loop output signal and outputs a signal representative of the point of the phase-lock loop output cycle at which a logic state transition of the input signal is detected. In addition, a self-sweeping autolock circuit interacts with the loop filter in such a manner that the self-sweeping autolock circuit commands the loop filter to sweep its output signal when phase-lock is absent and the loop filter halts the sweep of its output signal when phase-lock is acquired.

35 Claims, 5 Drawing Sheets

SELF-SWEEPING AUTOLOCK PLL

CROSS-REFERENCE TO RELATED APPLICATIONS

The present application is based on, and claims priority from, provisional application Serial No. 60/052,284, filed Jul. 11, 1997, entitled "Self-Sweeping Autolock PLL", which is in corporated herein in its entirety by reference.

STATEMENT REGARDING FEDERALLY SPONSORED RESEARCH OR DEVELOPMENT

N/A

BACKGROUND OF THE INVENTION

1. Field of the Invention

The present invention generally relates to a phase-locked loop ("PLL") circuit. In particular, the present invention relates to a phase-locked loop circuit with a digital phase detector and a self-sweeping autolock sub-circuit.

2. Description of the Related Art

The increasing use of digital communications has brought with it the need for innovative solutions to new communications challenges resulting from the nature of digital communications. A need also exists for improved solutions for general communications challenges that may have been solved adequately for legacy analog communications systems, but that now require enhanced solutions for digital communications.

One such problem particular to digital communications is the need to extract a digital clock from a data stream. Though the expected data rate of the data stream may be known, the actual data rate and signal quality received may vary significantly. Factors that affect the frequency and quality of the data stream include imperfections in the transmitting and receiving equipment, an increasingly hostile air interface, the complications arising from the increasing use of mobile transmitters and receivers, and the like.

In the past, the phase-locked loop ("PLL") has been proposed to extract clock signals from data streams. However, conventional PLLs have experienced some limitations. One limitation related to PLLs in general is that it is difficult to lock to the phase of an input signal having a frequency out of a range of frequencies onto which a particular PLL is designed to lock. A popular solution to this problem is to add a frequency sweep circuit which forces the output frequency of the PLL to sweep across a frequency range in an attempt to direct the output PLL frequency to pass close enough to the frequency of the input waveform to enable the PLL to phase-lock. Most conventional implementations of this strategy require that the frequency sweep circuitry use a separate oscillator and corresponding phase-lock detection circuitry. However, one disadvantage of the conventional frequency sweep circuit is that it requires more complex circuitry and a higher resulting cost, larger size and less reliability. Other implementations of the PLL output frequency sweeping strategy involve the utilization of positive feedback in the PLL active loop filter as disclosed in U.S. Pat. No. 4,206,420. The system of the '420 patent attempts to eliminate the need for a separate sweep oscillator and phase-lock detection circuitry. However, the system of the '420 patent has a disadvantage in that it causes the response characteristics of the loop filter to be dependent upon whether the PLL is in a phase-lock mode or a phase-lock-acquisition mode. In addition, the loop filter response characteristics of the '420 patent are affected in such a way that a steady state phase error is introduced when the PLL is in the phase-lock mode.

Another limitation of conventional PLLs for extracting frequency components of an input digital data stream relates to the phase detectors employed in such PLLs. The phase detector used in the typical PLL is a multiplying type of detector. Multiplying phase detectors function well in the presence of noise. However, a disadvantage is that multiplying phase detectors have a limited frequency range over which they may achieve phase-lock, thereby resulting in the need for an additional sweep generator. Another solution occasionally employed is the use of a phase frequency detector which, when out of lock, will steer the PLL back in the direction necessary to achieve lock. A disadvantage of the conventional phase frequency detector is that a noisy data stream may contain extra pulses which may cause the phase frequency detector to identify an "out of lock" state when the PLL in fact is still phase locked. A false "out of lock" identification causes the PLL to lose lock temporarily in an attempt to correct itself. The unnecessary corrective action can result in a missing cycle in the PLL output clock which may then result in missing data bits, which is less than desirable.

Therefore, a need remains for an improved PLL that is able to overcome the foregoing problems.

SUMMARY OF THE INVENTION

It is an object of the present invention to address the aforementioned problems through the implementation of an improved phase-lock loop design with a digital phase detector and self-sweeping autolock sub-circuit.

One object of the present invention is to provide a phase-lock loop with the ability to lock directly to a binary data stream.

Another object of the present invention is to provide a phase-lock without a separate sweep oscillator and the related phase-lock detection circuitry.

Another object of the present invention is to provide a phase-lock loop which introduces an insignificant steady-state phase error.

Another object of the present invention is to provide a phase-lock loop which automatically enters the sweeping mode of operation in the absence of phase-lock and which automatically leaves the sweeping mode when phase-lock is acquired.

Another object of the present invention is to provide a phase-lock loop with the ability to accept noisy data streams without losing phase-lock.

Another object of the present invention is to provide a sweep control circuit integrated into the phase-lock loop circuit in a manner such that it does not affect the response characteristics of the loop filter.

These and other objectives are achieved by an improved phase-lock loop circuit comprising a phase detector, a loop filter, and a voltage controlled oscillator. The phase detector samples the phase-lock loop input signal at various points in a cycle of the phase-lock loop output signal and outputs a signal representative of the point of the phase-lock loop output cycle at which a logic state transition of the input signal is detected. In addition, a self-sweeping autolock circuit interacts with the loop filter in such a manner that the self-sweeping autolock circuit commands the loop filter to sweep its output signal when phase-lock is absent and the loop filter halts the sweep of its output signal when phase-lock is acquired.

DETAILED DESCRIPTION OF THE PREFERRED EMBODIMENT

Figure 1:
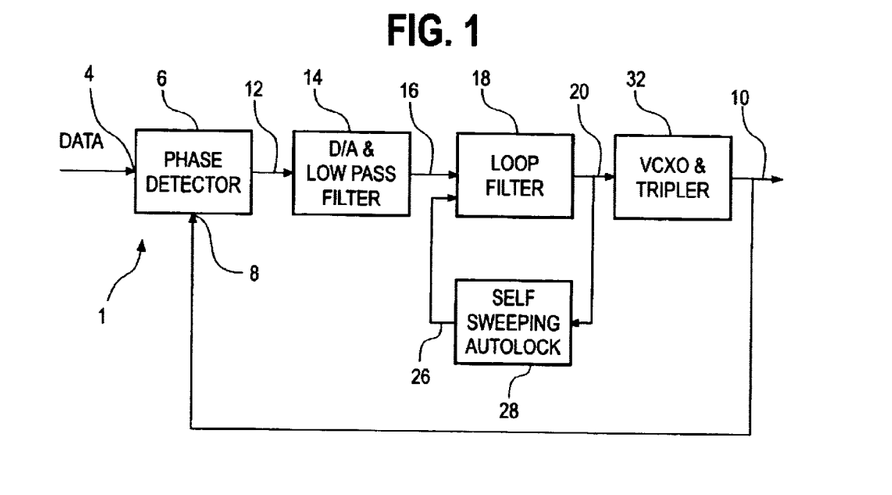
FIG. 1 illustrates a high level block diagram of a self-sweeping autolock phase lock loop according a preferred embodiment of the present invention.

FIG. 1 illustrates a block diagram of the general components of a self sweeping autolock phase-lock loop 1 according to a preferred embodiment of the present invention. FIG. 1 shows a data stream Data arriving at the data input 4 of a phase detector 6. The phase detector sub-circuit 6 detects the phase difference between the data input 4 and a feedback clock input 8 which also constitutes the output clock 10 of the phase-lock loop ("PLL") 1. The phase detector 6 outputs a phase difference signal 12 representative of the phase difference between the data input 4 and feedback clock input 8. The phase difference 12 is fed into a D/A and low pass filter block 14. The D/A and low pass filter block 14 converts the digital phase difference signal 12 into an analog phase difference signal through the utilization of a D/A converter. The analog phase difference signal is then fed through a low pass filter to filter out high frequency noise. A filtered analog phase difference signal 16 is output from the D/A and low pass filter block 14 and passed to the loop filter 18. The loop filter 18 outputs a control voltage signal 20, which is passed to a voltage controlled crystal oscillator ("VCXO") 32 and in a feed-back loop to a self-sweeping autolock sub-circuit ("SSA") 28. The SSA 28 determines when the PLL 1 has lost phase lock. The loop filter 18 calculates the value of the control voltage signal 20 based on the phase difference signal 16 and a phase search signal 26 from the self-sweeping sweeping autolock sub-circuit 28. The loop filter 18 may be standard filter known in the art. One of ordinary skill in the art will realize that the VCXO 32 may be more generally replaced with a voltage controlled oscillator ("VCO")

The self-sweeping autolock sub-circuit 28 ("SSA") causes the loop filter 18 to vary the control voltage signal 20 in a sweeping manner across a predefined range in the absence of phase lock. Phase lock is lost by the phase-lock loop 1 when the frequency between the data input 4 and the output clock 10 exceeds a predetermined maximum frequency difference. The SSA 28 receives the control signal 20 from the loop filter 18. The phase difference signal 16 identifies the phase difference between input data 4 and the output clock 10. If the value of the control signal 20 is outside the range of acceptable values, the SSA 28 determines that phase lock is absent. When phase lock is lost, the SSA 28 enters a mode in which it outputs a phase search signal 26 which causes the loop filter 18 control voltage signal 20 to sweep a predetermined range of values. The control voltage signal 20 commands the voltage controlled crystal oscillator ("VCXO") 32 to generate a clock output 10 which sweeps a frequency range from a maximum frequency of the expected PLL input data stream Data to a minimum frequency of the expected PLL input data stream Data. The sweeping operation continues in a repetitive manner until phase lock is acquired. The VCXO 32 outputs a clock signal 10 having a frequency that is a function of the input control voltage signal 20 received from the loop filter 18.

Figure 2:
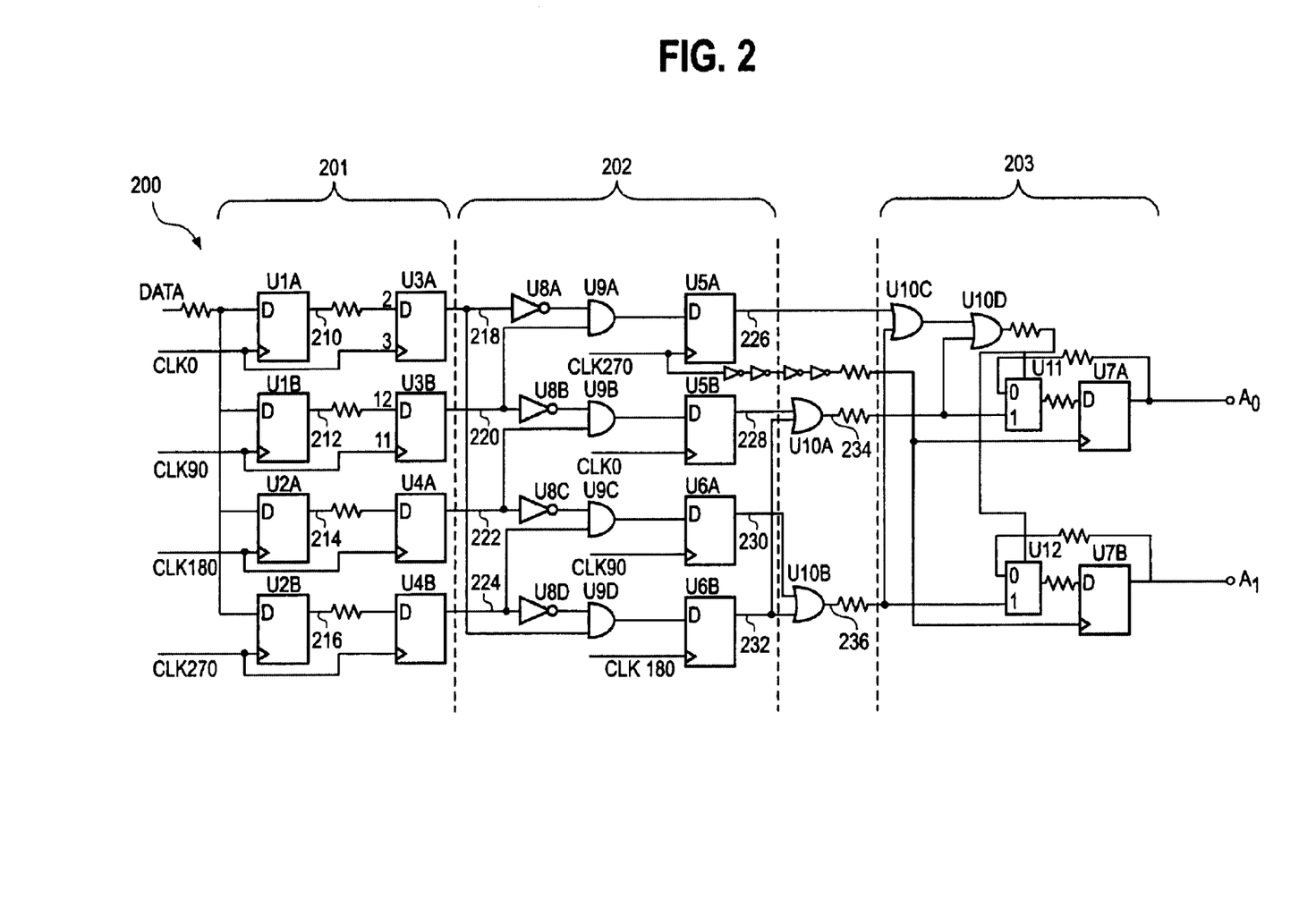
FIG. 2 illustrates a schematic diagram of a digital phase detector sub-circuit of a PLL according to a preferred embodiment of the present invention.

Reference is now made to FIG. 2, which is a schematic diagram of a preferred embodiment of the phase detector circuit 200 of the present invention. The phase detector circuit 200 may be divided into an input buffer and section sampler stage 201, a section transition detector stage 202 and an output stage 203, each of which is explained below in more detail. The input buffer and section sampler stage 201 samples and stores data levels of the data input 4 at predetermined points in time. The section transition detector stage 202 tests the stored data levels to determine when the logic level of the data input 4 changes state with respect to predefined discrete sections of a clock cycle. By way of example only, the clock cycle may be partitioned into four quadrants. The section transition detector stage 202 determines when the data input 4 changes state and in which quadrant. The output stage 203 generates a digital signal indicating the section in which a transition occurred.

The circuit 200 receives an input data stream Data (which corresponds to the data input 4 of the phase detector 6 in FIG. 1) and a clock signal CLK0 (which corresponds to the clock output 10 at input 8 of the phase detector 6 of FIG. 1). The circuit 200 also receives a clock signal CLK90 which parallels to clock signal CLK0 with a 90° phase lag, a clock signal CLK180 which parallels clock signal CLK0 with a 180° phase lag, and a clock signal CLK270 which parallels clock signal CLK0 with a 270° phase lag.

By way of example only, a set of D flip-flops (U1A, U1B, U2A, U2B, U3A, U3B, U4A, and U4B) may be used to form the input buffer and section sampler stage 201 of the phase detector circuit 200. Clock signals CLK0, CLK90, CLK180, and CLK270 are connected to the clock inputs of D flip-flops U1A, U1B, U2A, and U2B, respectively. Alternatively, the number of clock signals may be varied. Similarly, the D Flip-flops may be replaced with equivalent logic circuits, discrete or integrated. Alternatively, the phase lags between clock signals need not equal 90°, 180° and 270°, but instead may vary. For instance, only two clock signals may be used. As a further example, the phase lags may be uneven, such as 90°, 135°, 180°, 225° and 270°.

The output 210 of D flip-flop U1A functionally represents the logic value of the data input Data at the most recent transition of input clock CLK0 (e.g., a low-to-high transition). The output 212 of D flip-flop U1B represents the logic value of the data input Data at the most recent low-to-high transition of input clock CLK90. The output 214 of the D flip-flop U2A represents the logic value of the data input Data at the most recent low-to-high transition of input clock CLK180. The output 216 of the D flip-flop U2B represents the logic value of the data input Data at the most recent low-to-high transition of input clock CLK270. It will be understood by one of ordinary skill in the art that a "low" is a signal with a voltage value representative of a particular logic value (typically false), and a "high" is a signal voltage value representative of the particular logic value (typically true) not defined by "low". Alternatively, logic values and/or their representations (false/true) may be switched. D flip-flops U1A, U1B, U2A, and U2B may store samples of the input data taken at predefined sections, for example every ¼ cycle (one sample per quadrant) of the input clock CLK0.

A quadrant may correspond to a 90° section of the input clock CLK0, where quadrant 1 may be defined as the portion of a cycle of the input clock CLK0 from the rising edge to ½ of the way to the next falling edge, quadrant 2 may be from the end of a quadrant 1 to the next falling edge of a cycle of the input clock CLK0, quadrant 3 may be from the falling edge of a cycle of the input clock CLK0 to ½ of the way to the next rising edge, and quadrant 4 may be from the end of a quadrant 3 to the next rising edge of a cycle of the input clock CLK0.

A second set of four D flip-flops (U3A, U3B, U4A, and U4B) may be cascaded with the first set of D flip-flops U1A, U1B, U2A, and U2B, respectively, such that the second set stores the logic values stored in the first set, one clock cycle later. The outputs 210–216 are connected to the data inputs of D flip-flops UA3, U3B, U4A and U4B, respectfully. The output 218 of D flip-flop U3A represents D flip-flop U1A output 210 delayed by one clock cycle. The output 220 D flip-flop U3B represents D flip-flop U1B output 212 delayed by one clock cycle. The outputs 222 and 224 represent outputs 214 and 216, respectfully, delayed by one clock cycle.

By way of example only, the D flip-flop outputs 218, 220, 222, and 224 represent four consecutive samples of the input data stream Data taken at ¼ cycle intervals (one sample per quadrant) of the clock input CLK0. To add clarity to the remainder of this discussion, the sample of the data input Data represented by D flip-flop U3A output 218 will be referred to as the quadrant 1 sample, the data sample represented by D flip-flop U3B output 220 will be referred to as the quadrant 2 sample, the data sample represented by D flip-flop U4A output 222 will be referred to as the quadrant 3 sample, and the data sample represented by D flip-flop U4B output 224 will be referred to as the quadrant 4 sample. It will be understood by one of ordinary skill in the art that the clock input CLK0 may be sectioned in many ways other than equal quadrants. For example, clock input CLK0 may be sectioned into sections of unequal size, or clock input CLK0 may be sectioned into a number of sections other than four.

Next, an exemplary embodiment of the section transition detector stage 202 is described. The transition detector 202 determines the clock cycle section in which a low-to-high transition of data input Data occurs. The output 218 of D flip-flop U3A is connected to AND gate U9D and to AND gate U9A through an inverter U8A. The output 220 of D flip-flop U3B is connected to AND gate U9A and to AND gate U9B through an inverter U8B. The output 222 of D flip-flop U4A is connected to AND gate U9B and to AND gate U9C through an inverter U8C. The output 224 of D flip-flop U4B is connected to AND gate U9C and to AND gate U9D through an inverter U8D. The output of AND gate U9A is connected to D flip-flop U5A, which is clocked by clock signal CLK270. The outputs of AND gates U9B, U9C and U9D are connected to D flip-flops U5B, U6A and U6B, respectfully, and clocked by clock signals CLK0, CLK90 and CLK180. The outputs of D flip-flops U5A, U5B, U6A, and U6B indicate whether a low-to-high transition has occurred in their corresponding quadrants of interest.

For example, a data input Data logic low quadrant 1 sample followed by a logic high quadrant 2 sample during a clock cycle will be indicated by a logic low on D flip-flop U3A output 218 and a logic high on D flip-flop U3B output 220. The D flip-flop outputs 218 and 220 result in two logic high signals on the inputs of AND gate U9A, which result in a logic high signal at the data input of D flip-flop U5A, which results in a D flip-flop U5A output 226 of logic high upon the arrival of a low-to-high transition of clock signal CLK270 at the clock input of D flip-flop U5A. A data input Data logic low quadrant 2 sample followed by a logic high quadrant 3 sample during a clock cycle will be indicated by a logic low on D flip-flop U3B output 220 and a logic high on D flip-flop U4A output 222. The D flip-flop outputs 220 and 222 result in two logic high signals on the inputs of AND gate U9B, which result in a logic high signal at the data input of D flip-flop U5B, which results in a D flip-flop U5B output 228 of logic high upon the arrival of low-to-high transition of clock signal CLK0 at the clock input of D flip-flop U5B. A data input Data logic low quadrant 3 sample followed by a logic high quadrant 4 sample during a clock cycle will be indicated by a logic low on D flip-flop U4A output 222 and a logic high on D flip-flop U4B output 224. The D flip-flop outputs 222 and 224 result in two logic high signals on the inputs of AND gate U9C, which result in a logic high signal at the data input of D flip-flop U6A, which results in a D flip-flop U6A output 230 of logic high upon the arrival of low-to-high transition of clock signal CLK90 at the clock input of D flip-flop U6A. A data input Data logic low quadrant 4 sample followed by a logic high quadrant 1 sample during a clock cycle will be indicated by a logic low on D flip-flop U4B output 224 and a logic high on D flip-flop U3A output 218. The D flip-flop outputs 224 and 218 result in two logic high signals on the inputs of AND gate U9D, which result in a logic high signal at the data input of D flip-flop U6B, which results in a D flip-flop U6B output 232 of logic high upon the arrival of low-to-high transition of clock signal CLK180 at the clock input of D flip-flop U6B.

The outputs of the section transition detector 202 of phase detector circuit 200 operate as follows. D flip-flop U5A output 226 will change to a logic high state when the data stream Data switches from a logic low quadrant 1 sample to a logic high quadrant 2 sample. D flip-flop U5B output 228 changes to a logic high state when the data stream Data switches from a logic low quadrant 2 sample to a logic high quadrant 3 sample. D flip-flop U6A output 230 changes to a logic high state when the data stream Data switches from a logic low quadrant 3 sample to a logic high quadrant 4 sample. D flip-flop U6B output 232 changes to a logic high state when the data stream Data switches from a logic low quadrant 4 sample to a logic high quadrant 1 sample. One of ordinary skill in the art will realize that no state change will occur if the desired next state is the same as the current state.

OR gates U10A and U10B may be used to encode the output of the section data transition detector 202 into binary format. D flip-flop U5B output 228 is connected to an input of OR gate U10A, D flip-flop U6A output 230 is connected to an input of OR gate U10B, and D flip-flop U6B output 232 is connected to an input of OR gate U10A and to an input of OR gate U10B. OR gate U10A output 234 is connected to multiplexer U11 input 1 and OR gate U10B output 236 is connected to multiplexer U12 input 1. A logic low quadrant 1 sample of the data stream Data followed by a logic high quadrant 2 sample of the data stream Data will cause OR gates U10A and U10B to output logic low states. A logic low quadrant 2 sample of the data stream Data followed by a logic high quadrant 3 sample of the data stream Data will cause OR gates U10A and U10B to output logic high and logic low states, respectively. A logic low quadrant 3 sample of the data stream Data followed by a logic high quadrant 4 sample of the data stream Data will cause OR gates U10A and U10B to output logic low and logic high states respectively. A logic low quadrant 4 sample of the data stream Data followed by a logic high quadrant 1 sample of the data stream Data will cause OR gates U10A and U10B to output logic high states. In addition, the absence of a low-to-high transition of the data stream Data for four consecutive quadrant samples will cause OR gates U10A and U10B to output logic low states.

The output stage 203 of the phase detector circuit 200 may be clocked by clock CLK270, which is connected to the clock inputs of D flip-flops U7A and U7B through four inverters used for timing purposes. The output line of multiplexer U11 is connected to the data input of D flip-flop U7A through a resistor, and the input data value is then transferred to output $A_0$ upon the arrival of a low-to-high clock transition at the clock input of D flip-flop U7A. The output line of multiplexer U12 is connected to the data input of D flip-flop U7B through a resistor and the input data value is then transferred to output $A_1$ upon the arrival of a low-to-high clock transition at the clock input of D flip-flop U7B. One of ordinary skill in the art will realize that the use of resistors to establish digital connections is optional.

In the absence of a low-to-high transition of data input Data during a clock cycle, starting at a low-to-high transition of clock CLK270, the phase detector circuit 200 maintains the logic levels of its current output signals $A_1$ and $A_0$. Otherwise, the binary representation of the most recently processed low-to-high transition of data input Data is output. As mentioned above, two D flip-flops (U7A and U7B) store the output signal levels ($A_0$ and $A_1$, respectively) and receive their data input signals from multiplexers U11 and U12, respectively. Also mentioned above is that one input of multiplexer U11 is connected to the output 234 of OR gate U10A, and that one input of multiplexer U12 is connected to the output 236 of OR gate U10B. The output values of OR gates U10A and U10B represent data indicating in which quadrant sample a low-to-high transition of data input Data was detected. The data to be output in the absence of a low-to-high transition is the output data already present on D flip-flop outputs $A_1$ and $A_0$. Therefore, the data present on D flip-flop outputs $A_1$ and $A_0$ is fed back to the inputs of the multiplexers.

More specifically, D flip-flop U7A output $A_0$ is connected to input 0 of multiplexer U11 through a resistor, and D flip-flop U12 output $A_1$ is connected to input 0 of multiplexer U12 through a resistor. The decision of which multiplexer input to present to D flip-flops U7A and U7B is made through the use of two OR gates U10C and U10D. The output of OR gate U10B (which indicates the detection of a low-to-high data transition of the input data Data in quadrant samples 1 or 4) is connected through a resistor to an input of OR gate U10C. The output of D flip-flop U5A (which indicates the detection of a low-to-high data transition in the quadrant 2 sample) is also connected to an input of OR gate U10C. Thus the output of OR gate U10C indicates the detection of a low-to-high data transition in any of quadrant samples 1, 2, or 4. The output of OR gate U10C is connected to an input of OR gate U10D. Additionally, the output of OR gate U10A (which indicates the detection of a low-to-high transition of the input data Data in quadrant samples 1 or 3) is connected through a resistor to an input of OR gate U10D. Thus, the output of OR gate U10D indicates the detection of a low-to-high transition of input data in any of the four quadrant samples.

The output of OR gate U10D will change to a logic high state when a low-to-high transition of input data Data is detected in any of the four quadrant samples and maintains a logic low state when no such transition is detected. The output of OR gate U10D is then connected to the data selection input of multiplexers U11 and U12. Thus, when a low-to-high transition of input data Data is detected, the signals supplied to the output D flip-flops U7A and U7B by multiplexers U11 and U12, respectively, are the outputs 234 and 236 from OR gates U10A and U10B respectively, which are the binary representation of the quadrant sample in which the data transition was detected. When no low-to-high transition of input data Data is detected, the logic low output from OR gate U10D will result in multiplexer U11 presenting D flip flop U7A with the signal currently being output on D flip flop U7A output $A_0$, and will result in multiplexer U12 presenting D flip flop U7B with the signal currently being output on D flip flop U7B output $A_1$. Thus, no change will occur in the output of the phase detector circuit 200.

Figure 3:
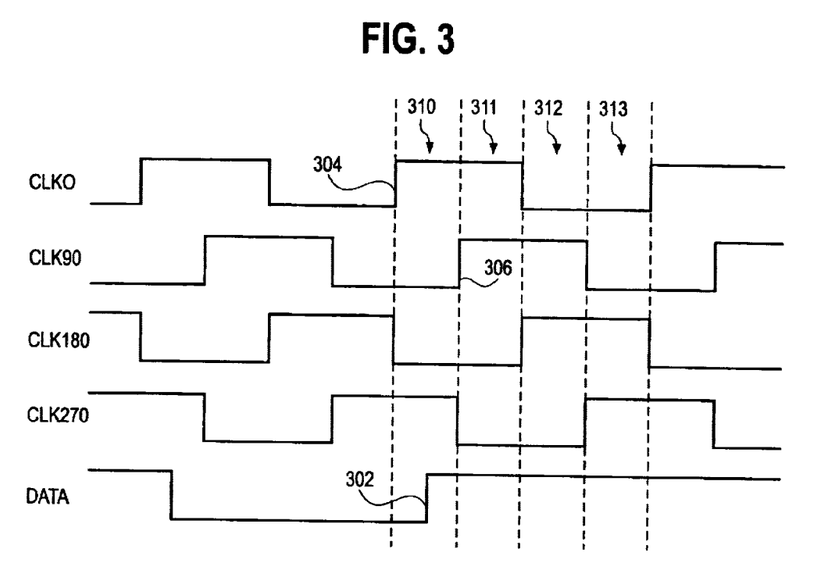
FIG. 3 illustrates an exemplary timing diagram of one possible set of phase detector input signals according to a preferred embodiment of the present invention.

FIG. 3 illustrates an exemplary timing diagram in which a low-to-high transition 302 occurs in the input data stream Data (also shown as data input Data in FIG. 1 and FIG. 2). Also illustrated is the relationship between the clock CLK0 (also shown in FIG. 2), clock CLK90 (also shown in FIG. 2), clock CLK180 (also shown in FIG. 2), and CLK270 (also shown in FIG. 2). In the illustration of FIG. 3, a low-to-high transition 302 of data stream Data occurs between the low-to-high transition 304 of CLK0 and a low-to-high transition 306 of CLK90. Transition 302 would be detected by the quadrant 2 sample. The first through fourth quadrants are illustrated by reference numbers 310–313 in FIG. 3. Referring to FIG. 2, the data transition scenario illustrated in FIG. 3 would result in a D flip-flop U7A output $A_0$ of logic low and a D flip-flop U7B output $A_1$ of logic low. Table 1 correlates the data phase position, the output of the phase detector circuit 200 and the output of the D/A converter and low pass filter 14 to be discussed next, for the preferred embodiment. Note that the output levels of the D/A converter and low pass filter listed in Table 1 are steady state values.

TABLE 1

| Phase Detector Output | Output of D/A Converter and Low Pass Filter | Data Phase Position |
| --- | --- | --- |
| 00 | 0.0 V | between 0° and 90° |
| 01 | 1.7 V | between 90° and 180° |
| 10 | 3.3 V | between 180° and 270° |
| 11 | 5.0 V | between 270° and 0° |

Referring to FIG. 1, D/A & Low Pass Filter block 14 comprises a D/A converter for the conversion of the digital output from the phase detector 6, and a low pass filter to filter out unwanted high frequency noise. The loop filter 18 may contain an adder circuit used to offset the signal value 16 received from the D/A & low pass filter 14 to a desired value, which will be discussed further in the following discussion of the interaction between the loop filter circuit 18 and the self-sweeping autolock circuit 28.

Figure 4:
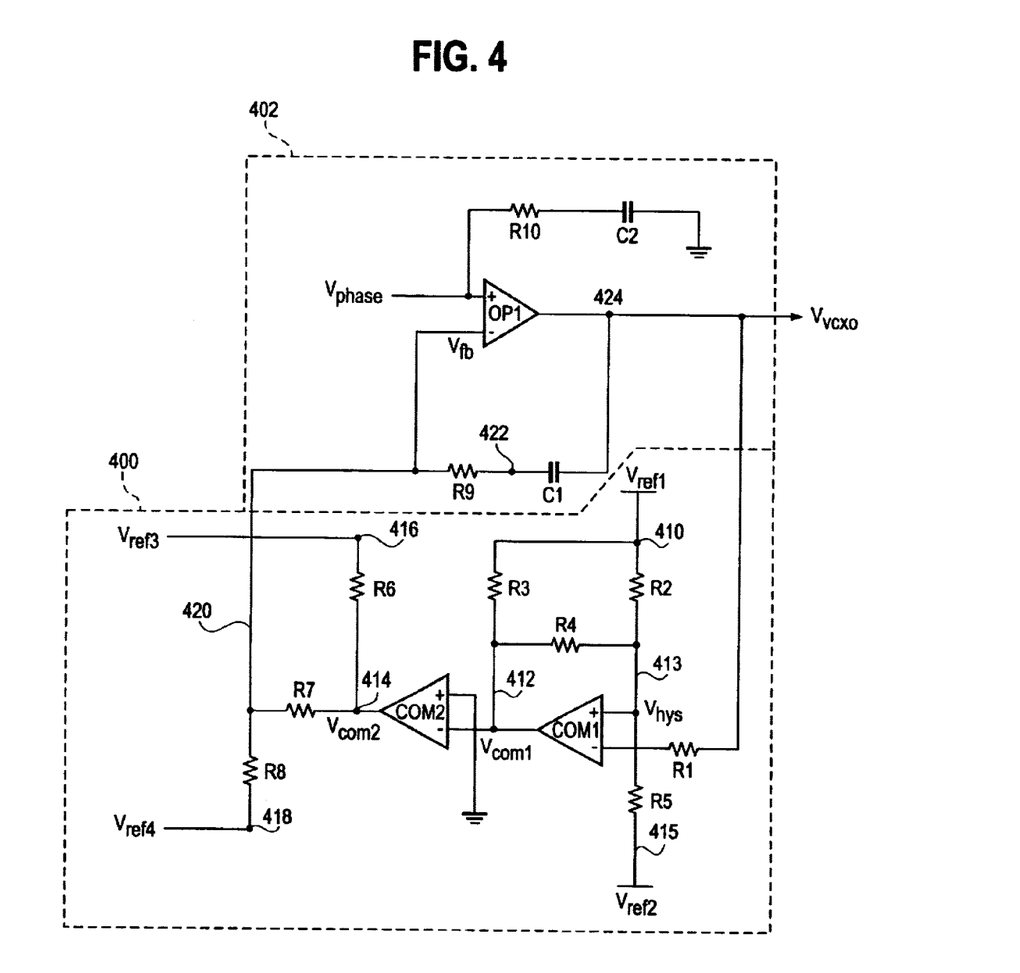
FIG. 4 illustrates a schematic diagram of a self-sweeping autolock sub-circuit of a PLL according to a preferred embodiment of the present invention.

Reference is now made to FIG. 4, which is a schematic diagram of an exemplary embodiment of the self-sweeping autolock ("SSA") circuit 400 of the present invention (which corresponds to the self-sweeping autolock circuit 28 in FIG. 1). Also illustrated in FIG. 4, is a schematic diagram of the loop filter circuit 402, which is a portion of the loop filter block 18 of FIG. 1. The first stage of the SSA circuit 400 is a hysteresis circuit made up of a comparator COM1, and a voltage divider circuit comprising resistors R2, R3, R4, and R5. The purpose of the hysteresis circuit is to detect when the VCXO control voltage $V_{VCXO}$ (also shown as signal 20 in FIG. 1) is in or out of a predetermined voltage range and to adjust its output voltage $V_{COM1}$ accordingly. Resistors R2 and R3 are connected to a reference voltage source $V_{ref1}$ at node 410. Resistors R3 and R4 are connected to the output of comparator COM1 at node 412. Resistors R2, R4, and R5 are connected to the non-inverting input of comparator COM1 at node 413. Resistor R5 is connected to a reference voltage source $V_{ref2}$ at node 415. The VCXO control voltage output $V_{vcxo}$ from the loop filter circuit 402 op-amp OP1 is connected, through resistor R1, to the inverting input of comparator COM1. The voltage value at node 414 will be referred to as $V_{hys}$. $V_{hys}$ is a function of $V_{ref1}$, $V_{ref2}$, R2, R3, R4, R5, and the output voltage $V_{COM1}$ of COM1. One of ordinary skill in the art will realize that the values of the aforementioned components may vary substantially depending on the details of the hysteresis behavior desired from the circuit. By way of example only, for the preferred embodiment the values chosen may be: $V_{ref1}$=+5V, $V_{ref2}$=−5V, R2=8.25K, R3=22.1K, R4=3.32K, and R5=33.2K. Comparator COM1 may be a LM393 connected in such a manner that its output signal $V_{COM1\ is}$ −5V for the case where the voltage at the inverting input $V_{VCXO}$ is greater than the voltage at the non-inverting input $V_{hys}$, and its output is in a high impedance state for the case where the voltage at the inverting input $V_{VCXO}$ is less than the voltage at the non-inverting input $V_{hys}$.

When the PLL 1 is operating under conditions of phase lock, the VCXO control voltage $V_{VCXO}$ output from the loop filter circuit 402 is at a voltage level within a predetermined range. The loop filter circuit 402 may operate such that the absence of phase lock results in a decreasing value of $V_{VCXO}$ (also referred to as sweeping). Under conditions of phase lock and during sweeping, the value of the non-inverting input $V_{hys}$ may be at the minimum acceptable voltage value for $V_{VCXO}$. For the components and voltage values of the preferred embodiment, the output of COM1 is −5V, and voltage division may yield a $V_{hys}$ value of approximately −2.3V. The COM1 output may remain at −5V until the voltage value at the inverting input $V_{VCXO}$ of comparator COM1, becomes less than −2.3V.

Figure 5:
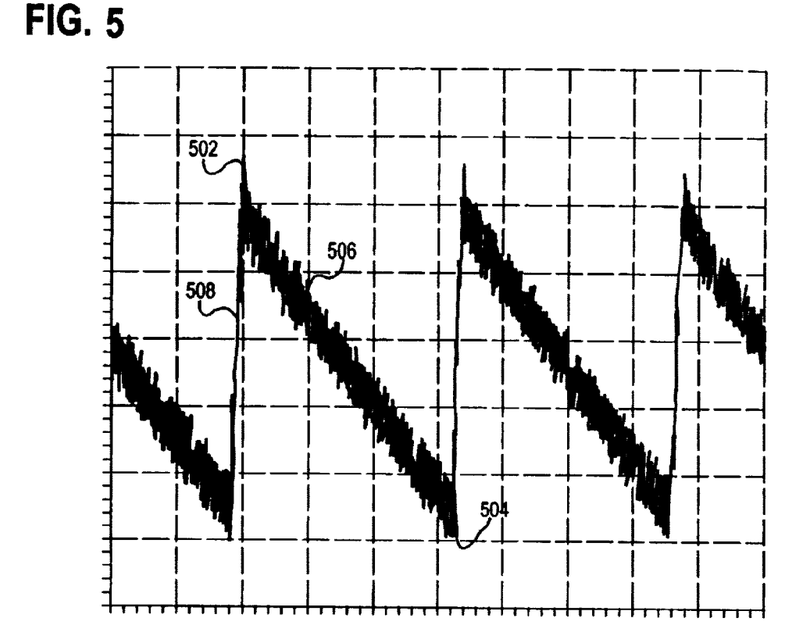
FIG. 5 illustrates an exemplary control voltage signal applied to the voltage controlled oscillator of a PLL during phase acquisition according to a preferred embodiment of the present invention.

Since the circuit is designed in such a way that the VCXO control voltage $V_{VCXO}$ output from the loop filter 402 may continually decrease in the absence of phase lock, $V_{VCXO}$ will eventually become less than $V_{hys}$ in the absence of phase lock. When $V_{VCXO}$ becomes less than $V_{hys}$, the output of COM1 will change states. This state change will then result in a different value for $V_{hys}$. For the components and voltage values of the preferred embodiment described above, when $V_{VCXO}$ becomes less than the $V_{hys}$ of −2.3V, the output of COM1 will change to the high impedance state. This changed COM1 output state will then result in a value of $V_{hys}$ of approximately 3.4V. The output of COM1, and hence the value of $V_{hys}$, will remain in this state until the voltage value at the inverting input of COM1 ($V_{VCXO}$) exceeds the voltage value at the non-inverting input of COM1 ($V_{hys}$). As will be described in more detail shortly, the state of COM1 may result in a continually increasing value of the VCXO control voltage $V_{VCXO}$ which will continue to increase until it exceeds the value of $V_{hys}$. In the preferred embodiment, this positive ramping of $V_{VCXO}$ occurs under circuit conditions that will not allow phase lock to occur. This serves functionally as a $V_{VCXO}$ reset in preparation for the next negative sweep of $V_{VCXO}$. For the components and voltage values of the preferred embodiment, $V_{VCXO}$ will increase from −2.3V to 3.4V. Once $V_{VCXO}$ exceeds $V_{hys}$, the output of COM1 will change back to −5V, and the hysteresis circuit will be back in the phase lock and negative sweep state described above. The high 502 and low 504 hysteresis switching points for the preferred embodiment are illustrated in FIG. 5, which is an oscilloscope output for the preferred embodiment of the current invention.

Summarizing what was referred to above as the hysteresis stage of the self-sweeping autolock circuitry 400 of the preferred embodiment, the output of comparator COM1 is −5V under conditions of phase lock and during the process of negatively sweeping the VCXO control signal $V_{VCXO}$. The output of comparator COM1 is set to a high impedance state during the process of resetting the VCXO control signal $V_{VCXO}$ to its maximum desired value in preparation for the next negative sweep.

Following the hysteresis stage of the self-sweeping autolock circuit is a comparator COM2, which serves to isolate the hysteresis stage and also to manipulate the output signal from comparator COM1. The inverting input of comparator COM2 is connected to node 412 which is also connected to resistors R3 and R4, and the output of comparator COM1. The non-inverting input of comparator COM2 is connected to ground. The output of comparator COM2 is connected to R6 and R7 at node 414. One of ordinary skill in the art will realize that the comparator COM2 may be chosen from a plurality of commercially available comparators or may be replaced with a functional equivalent. In the preferred embodiment, COM2 was chosen to be a LM393 connected in such a manner that its output signal $V_{COM2}$ is −5V for the case where the voltage at the inverting input $V_{COM1}$ is greater than the voltage at the non-inverting input (0V), and its output is in the high impedance state for the case where the voltage at the inverting input $V_{COM1}$ is less than the voltage at the non-inverting input (0V). Thus, under the conditions of phase lock and during the process of negatively sweeping the VCXO control signal $V_{VCXO}$, the output $V_{COM2}$ of comparator COM2 is in the high impedance state, and during the process of resetting the VCXO control signal $V_{VCXO}$ to its maximum desired value in preparation for the next negative sweep, the output $V_{COM2}$ of comparator COM2 is −5V.

The output state of comparator COM2, the reference voltages $V_{ref3}$ and $V_{ref4}$, resistors R6, R7, R8 and R9, and capacitor C1 are chosen in such a way that the output state of comparator COM2 encourages the loop filter circuit 402 to ramp its output voltage $V_{VCXO}$ up or down, depending on the output voltage $V_{COM1}$ of comparator COM1. In addition, they are chosen in such a way as to control the rate of increase or decrease of filter circuit 402 output voltage $V_{VCXO}$. As mentioned previously, the output of comparator COM2 is connected to resistors R6 and R7 at node 414. Reference voltage source $V_{ref3}$ is connected to resistor R6 at node 416. Reference voltage source $V_{ref4}$ is connected to resistor R8 at node 418. Resistors R7, R8 and R9 are connected to the inverting input of loop filter op-amp OP1 at node 420. Resistor R9 is connected to capacitor C1 at node 422. Capacitor C1 and resistor R1 are connected to the output of loop filter op-amp OP1 which is the source of the VCXO control voltage $V_{VCXO}$. It will be understood by one of ordinary skill in the art that a plurality of interchangeable active components exist that would fit the function of this circuit, and that the values of the passive components may be chosen to achieve the desired PLL behavior. For the preferred embodiment the components and voltages selected were op-amp OP1=TL062, comparator COM2=LM393, resistors R6=3.92 kOhm, R7=27.4 kOhm, R8=39.2 kOhm, and R9=1.82 kOhm, capacitor C1=0.22 uF, and voltage sources $V_{ref3}$=2.5V and $V_{ref4}$=−2.5V.

As described previously, as the VCXO control signal $V_{VCXO}$ is swept negatively in the preferred embodiment, the output from comparator COM1 is −5V which results in the output of comparator COM2 assuming the high-impedance state. In the absence of the negative feedback loop (comprising resistor R9 and capacitor C1) of loop filter op-amp OP1, the result of this would be a small positive voltage $V_{fb}$ on the inverting input of op-amp OP1. In addition, the absence of phase lock results in an average input voltage $V_{phase}$ on the non-inverting input of op-amp OP1 of approximately 0V. The reason for this is that in the absence of phase lock and the existence of a valid input data stream, the average output from the D/A converter and low pass filter (14 in FIG. 1) is 2.5V, which is then offset to 0V through the use of the adder circuit mentioned earlier. Therefore, on average, the op-amp OP1 adjusts its output $V_{VCXO}$ to cause the current flow through the feedback loop comprising resistor R9 and capacitor C1 necessary to drive the voltage on the inverting input $V_{fb}$ to approximately 0V. The magnitude of this current is determined by the values of $V_{VCOM2}$, $V_{ref3}$, $V_{ref4}$, R6, R7, and R8. The magnitude of this current and the value of capacitor C1 will then determine the rate of change of the voltage across capacitor C1, which is directly related to the rate of change of the VCXO control voltage $V_{VCXO}$ output from op-amp OP1. For the component and voltage values of the preferred embodiment, the rate of change of voltage $V_{VCXO}$ during the negative sweep is approximately −70 Volts/second. FIG. 5 is an oscilloscope output of the preferred embodiment, which illustrates the negative sweeping of the VCXO control voltage 506.

Once the negatively sweeping VCXO control signal $V_{VCXO}$ crosses the lower hysteresis threshold, the circuit begins the process of resetting $V_{VCXO}$ to the higher hysteresis threshold in preparation for the next negative sweep. Reset is accomplished by ramping the VCXO control signal $V_{VCXO}$ in the positive direction at a rate significantly higher than the negative sweep rate discussed earlier. As was also discussed earlier, when the negatively sweeping $V_{VCXO}$ crosses the lower hysteresis threshold, the output state of comparator COM1 will change to the high-impedance state, which results in a voltage at the inverting input of comparator COM2 that is greater than the voltage at the non-inverting input, which results in an output voltage $V_{VCXO}$ from comparator COM2 of −5V. In the absence of the negative feedback loop (comprising resistor R9 and capacitor C1) of loop filter op-amp OP1, the result of this would be a relatively large negative voltage on the inverting input of op-amp OP1. Again, the absence of phase lock results in an average input voltage $V_{phase}$ on the non-inverting input of op-amp OP1 of approximately 0V, and the loop filter op-amp OP1 adjusts its output $V_{VCXO}$ to cause the current flow through the feedback loop necessary to drive the average voltage on the inverting input $V_{fb}$ to approximately 0V. The magnitude of this current is determined by the values of $V_{VCOM2}$, $V_{ref3}$, $V_{ref4}$, R6, R7, and R8. The magnitude of this current and the value of capacitor C1 will then determine the rate of change of the voltage across capacitor C1, which is directly related to the rate of change of the VCXO control voltage $V_{VCXO}$ output from op-amp OP1. For the component and voltage values of the preferred embodiment, the rate of change of voltage $V_{VCXO}$ during the positive ramp is approximately 1100 Volts/second. This positive ramp occurs until the VCXO control voltage $V_{VCXO}$ reaches the higher hysteresis threshold at which point the output state of comparator COM1 changes back to −5V which initiates the negative sweeping process described above. FIG. 5 is an oscilloscope output of the preferred embodiment, which illustrates the sweeping pattern followed by the VCXO control voltage 508 to effect a reset operation.

Figure 6:
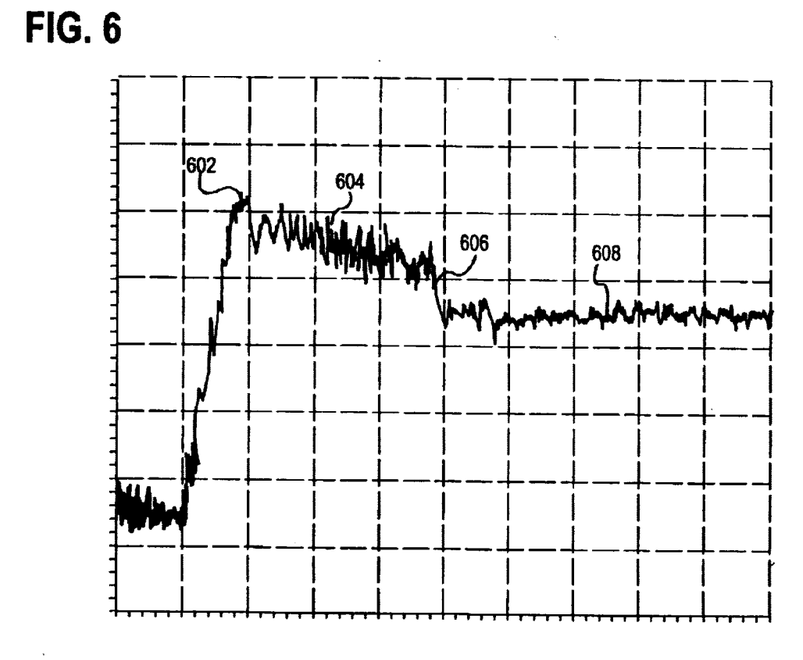
FIG. 6 illustrates an exemplary control voltage signal applied to the voltage controlled oscillator of a PLL after phase lock has been established according to a preferred embodiment of the present invention.

During the negative sweeping of the VCXO control voltage 506, the clock frequency output from the PLL (10 in FIG. 1) sweeps in a manner proportional to the control voltage 506. When a data stream is present at the input to the PLL (4 in FIG. 1) of a frequency within the range of frequencies swept by the PLL, and the frequency of the output clock is relatively close to the frequency of the input data stream, the frequency of the PLL locks onto the frequency of the input data stream. When lock occurs, the $V_{VCXO}$ sweeping of the self-sweeping autolock circuitry stops. The affect that lock acquisition has on the VCXO control voltage (20 in FIG. 1 and $V_{VCXO}$ in FIG. 4) is illustrated in FIG. 6, which is an oscilloscope output representing behavior of the preferred embodiment. Referring to FIG. 6, $V_{VCXO}$ begins its negative sweep at point 602. As $V_{VCXO}$ sweeps negatively 604, the frequency of the PLL output clock (10 in FIG. 1), which is a function of $V_{VCXO}$, becomes relatively close to the frequency of the input data stream (4 in FIG. 1) and phase lock occurs 606. After acquiring phase lock, the VCXO control voltage $V_{VCXO}$ will stop sweeping and maintain a relatively constant steady state value 608.

Referring back to FIG. 4, during phase lock, the self-sweeping autolock circuitry 400 continues to maintain the state which would, in the absence of phase lock, result in a negatively swept $V_{VCXO}$. That is, it acts to apply a relatively small positive voltage $V_{fb}$ to the inverting input of op-amp OP1. However, when phase lock occurs, the average voltage $V_{phase}$ at the non-inverting input of op-amp OP1 matches the voltage on the inverting input $V_{fb}$. Thus, a steady state situation is established in the loop filter circuit 402 where the average value of $V_{phase}$ equals the $V_{fb}$ that the self-sweeping autolock circuit 400 acts to establish, and the output VCXO control voltage $V_{VCXO}$ no longer has to equalize $V_{phase}$ and $V_{fb}$, which allows it to maintain a constant average voltage.

While particular elements, embodiments and applications of the present invention have been shown and described, it will be understood, of course, that the invention is not limited thereto since modifications may be made by those skilled in the art, particularly in light of the foregoing teachings. It is therefore contemplated by the appended claims to cover such modifications as incorporate those features which come within the spirit and scope of the invention.

We claim:

1. A phase-lock loop having components for extracting a digital clock signal from a digital data stream, the phase-lock loop receiving a digital data stream and outputting a digital clock signal representative of a data rate and phase of the digital data stream, the components comprising:

a clock generator circuit for generating a digital clock signal, said clock signal being divisible into multiple discrete sections;

a digital phase detector receiving the digital clock signal, said digital phase detector detecting a discrete sections in which the digital data stream changes logic state in order to establish a phase relationship between the digital data stream and the digital clock signal and generating a binary representation of the section of the digital clock signal in which the logic state change occurred.

2. The phase-lock loop of claim 1, wherein said digital phase detector outputs said binary representation of a section of the digital clock signal in which a change in the logic state of the digital data stream was detected, and wherein said digital detector divides the sections into at least four quadrants.

3. The phase-lock loop of claim 1, wherein said phase detector is comprised entirely of digital components.

4. The phase-lock loop of claim 1, wherein said phase detector divides a phase of the digital clock signal into four quadrants and outputs one of four binary states uniquely representing a quadrant in which the digital data stream changed states.

5. The phase-lock look of claim 1, wherein said digital phase detector divides the digital clock signal into said discrete sections.

6. A phase-lock loop for extracting a frequency from input signal including a digital data stream, the phase-lock loop comprising a phase detector, a loop filter, an oscillator and a sweep controller, the loop filter outputting a control signal to the oscillator, the phase-lock loop receiving an input signal and outputting an output signal representative of the frequency of the input signal, said phase detector outputting a phase error signal representative of a phase difference between the digital data stream and a digital clock signal, said phase error signal constituting a binary identification of a discrete phase section of the digital clock signal in which the digital data stream changes state, said sweep controller comprising:

a self-sweeping autolock circuit connected to, and receiving said control signal from, said loop filter, said self-sweeping autolock circuit outputting a phase search signal causing the loop filter to repeatedly sweep a predetermined range of frequencies having beginning and ending frequencies during each sweeping operation, the loop filter sweeping the output signal from the beginning frequency through the range of frequencies to the ending frequency while acquiring phase-lock and for terminating sweeping of the output signal through the range of frequencies when phase-lock is acquired, wherein said self-sweeping autolock circuit controls a sweeping operation in a manner that does not affect filter characteristics of said loop filter.

7. The phase-lock loop of claim 6, wherein said self-sweeping autolock circuit monitors a VCO control signal and outputs a reset command signal to said loop filter when the VCO control signal reaches a value indicating at least one of a loss of phase lock and a completion of a sweep, and wherein said self-sweeping autolock circuit outputs a sweep command signal to said loop filter when the VCO control signal reaches a value indicating that said loop filter has been reset.

8. The phase-lock loop of claim 6, wherein said oscillator generates a VCO control signal, and said self-sweeping autolock circuit comprising:

a hysteresis circuit to monitor the VCO control signal and output one of a signal indicating that a maximum hysteresis limit was a most recent hysteresis limit reached by the VCO control signal and a signal indicating that a minimum hysteresis limit was a most recent hysteresis limit reached by the VCO control signal.

9. The phase-lock loop of claim 6, wherein said self-sweeping autolock circuit is connected in a negative feedback path of said loop filter.

10. The phase-lock loop of claim 8, wherein said hysteresis circuit is connected in a negative feedback path of said loop filter.

11. The phase-lock loop of claim 6, wherein the control signal is a voltage control signal and the oscillator is one of a voltage controlled oscillator and a voltage controlled crystal oscillator.

12. The phase-lock loop of claim 6, wherein the phase search signal represents a reset command directing the loop filter to reset the sweeping operation to the beginning frequency, wherein each sweeping operation is carried out in the same direction.

13. The phase-lock loop of claim 6, wherein the self-sweeping autolock circuit causes the loop filter to reset the sweep to the beginning frequency between each sweeping operation.

14. The phase-lock loop of claim 6, wherein the self-sweeping autolock circuit detects when the sweep reaches one of a maximum and minimum frequency and, in response thereto, instructs the loop filter to reset a sweeping operation to an opposite one of the maximum and minimum frequency.

15. The phase-lock loop of claim 6, wherein the beginning and ending frequencies constitute high and low hysteresis switching points, respectively.

16. A phase-lock loop for extracting and outputting a digital clock signal from a digital data stream, comprising:

a phase detector for outputting a phase error signal representative of a phase difference between a digital data stream and a digital clock signal, said phase error signal constituting a binary identification of a discrete phase section of the digital clock signal in which the digital data stream changes state;

a VCO for producing the digital clock signal at a frequency based on a VCO control signal;

a loop filter for generating the VCO control signal based on the phase error signal and a sweep control signal; and a self-sweeping autolock circuit connected to said loop filter, for monitoring the VCO control signal and outputting the sweep control signal that causes the digital clock signal to repeatedly sweep through a range of frequencies in the absence of phase-lock and to cease sweeping through the range of frequencies when phase-lock is acquired, wherein said self-sweeping autolock circuit is implemented in a manner that does not affect the filter characteristics of said loop filter.

17. The phase-lock loop of claim 16, wherein said self-sweeping autolock circuit outputs a reset command signal to said loop filter when the VCO control signal reaches a value indicating one of a loss of phase lock and a completion of a sweep of the range of frequencies of the digital clock, said self-sweeping autolock circuit outputting a sweep command signal when the VCO control signal reaches a value indicating that said loop filter has been reset.

18. The phase-lock loop of claim 16, said self-sweeping autolock circuit comprising:

a hysteresis circuit monitoring the VCO control signal and outputting one of a signal indicating that a maximum hysteresis limit was a most recent hysteresis limit reached by the VCO control signal and a signal indicating that a minimum hysteresis limit was a most recent hysteresis limit reached by the VCO control signal.

19. The phase-lock loop of claim 16, wherein said self-sweeping autolock circuit is connected in a negative feedback path of said loop filter.

20. The phase-lock loop of claim 16, wherein said phase detector divides the digital clock signal into four quadrants and outputs one of four binary states uniquely representing a quadrant in which the digital data stream changed states.

21. A phase-lock loop for extracting and outputting a digital clock signal from a digital data stream comprising:

a phase detector for receiving a cycle of the digital clock signal divided into multiple discrete sections, and identifying a discrete section in which the digital data stream changes logic state in order to establish a phase relationship between the digital data stream and the digital clock signal, said phase detector outputting a binary phase error signal representative of an identified section;

a sweep controller for receiving a VCO control signal and generating a sweep control signal to cause sweeping of a frequency range of the digital clock signal during an absence of phase-lock and to cause termination of the sweeping of the frequency range of the digital clock when phase-lock is acquired;

a VCO for producing the digital clock signal at a frequency associated with the VCO control signal;

a loop filter for generating the VCO control signal based on the phase error signal and the sweep control signal.

22. The phase-lock loop of claim 21, said phase detector dividing said cycle into four discrete sections and outputting one of four binary states representative of the section in which the digital data stream changed states.

23. The phase-lock loop of claim 21, said phase detector further comprising:

a sampling sub-circuit to divide a cycle of the digital clock into sections and sample the digital data stream during each of the sections;

a section transition detection sub-circuit to determine the section of the digital clock signal in which the digital data stream changes state; and an output sub-circuit to convert information regarding the section of the digital clock signal in which a state change occurred into the desired output format.

24. The phase-lock loop of claim 21, said sweep controller comprising:

a self-sweeping autolock circuit for monitoring the VCO control signal and outputting the sweep control signal that causes the digital clock signal to repeatedly sweep through the frequency range in the absence of phase lock and to cease sweeping when phase lock is acquired, wherein said self-sweeping autolock circuit is implemented in a manner that does not affect filter characteristics of said loop filter.

25. The phase-lock loop of claim 24, wherein said phase detector is comprised entirely of digital components.

26. The phase-lock loop of claim 24, wherein said self-sweeping autolock circuit outputs a reset command signal to said loop filter when the VCO control signal reaches a value indicating one of a loss of phase lock and a completion of a sweep of the frequency range of the digital clock, said self-sweeping autolock circuit outputting a sweep command signal when the VCO control signal reaches a value indicating that said loop filter has been reset.

27. The phase-lock loop of claim 24, wherein said self-sweeping autolock circuit is connected in a negative feedback path of said loop filter.

28. The phase-lock loop of claim 21, wherein said phase detector divides the cycle of the digital clock signal into said multiple discrete sections.

29. The phase-lock loop of claim 6, and wherein said phase detector comprise a digital detector dividing a phase of said input signal into four quadrants and outputting one of four binary states uniquely representing a quadrant in which the digital data stream changes states.

30. The phase-lock loop of claim 6, wherein the control signal is a voltage control signal and the oscillator is one of a voltage controlled oscillator and a voltage controlled crystal oscillator.

31. The phase-lock loop of claim 6, wherein the phase search signal represents a reset command directing the loop filter to reset the sweeping operation to the beginning frequency, wherein each sweeping operation is carried out in the same direction.

32. The phase-lock loop of claim 6, wherein the self-sweeping autolock circuit causes the loop filter to reset the sweep to the beginning frequency between each sweeping operation.

33. The phase-lock loop of claim 6, wherein the self-sweeping autolock circuit detects when the sweep reaches one of a maximum and minimum frequency and, in response thereto, instructs the loop filter to reset a sweeping operation to an opposite one of the maximum and minimum frequency.

34. The phase-lock loop of claim 6, wherein the beginning and ending frequencies constitute high and low hysteresis switching points, respectively.

35. In the phase-lock loop having components adapted to extract a digital clock signal from a digital data stream, the phase-lock loop receiving a digital data stream and outputting a digital clock signal representative of a data rate and phase of the digital data stream, a phase detector sub-circuit comprising:

a digital phase detector receiving the digital clock signal, said clock signal being divisible into multiple discrete sections, said digital phase detector detecting the discrete section in which the digital stream change logic state in order to establish a phase relationship between the digital data stream and the digital clock signal and generating a binary representation of the section of the digital clock signal in which the logic state change occurred;

a sampling circuit to divide of the digital clock into at least two sections an sample the digital data stream during each of the sections;

a section transition detection circuit to determine the section of the digital clock signal in which the digital data stream changes state; and an output circuit to generate said binary representation of the digital clock signal in which the state change occurred.

* * * * *

UNITED STATES PATENT AND TRADEMARK OFFICE
CERTIFICATE OF CORRECTION

PATENT NO. : 6,704,382 B1
DATED : March 9, 2004
INVENTOR(S) : Steven Metzler et al.

It is certified that error appears in the above-identified patent and that said Letters Patent is hereby corrected as shown below:

Column 1,
Line 9, delete "in corporated" and substitute therefore -- incorporated --

Column 3,
Line 33, delete "8which" and substitute therefore -- 8 which --

Column 12,
Line 58, delete "sections" and substitute therefore -- section --

Column 13,
Line 14, after the word "from", insert -- an --
Line 18, delete "an" and substitute therefore -- the --

Column 14,
Line 7, delete "the" and substitute therefore -- a --
Line 24, delete "a" and substitute therefore -- the --
Line 67, after the word "comprising", insert -- at least a --

Column 15,
Line 26, delete "a cycle of"

Column 16,
Line 2, delete "the cycle of"
Line 31, delete "the" and substitute therefore -- a --
Line 40, delete "change" and substitute therefore -- changes --
Line 48, delete "an" and substitute therefore -- and --
Line 53, after the word "of", insert -- the section of --

Signed and Sealed this

Nineteenth Day of October, 2004

JON W. DUDAS
*Director of the United States Patent and Trademark Office*